(12) United States Patent
Mitsui et al.

(10) Patent No.: US 6,335,124 B1
(45) Date of Patent: *Jan. 1, 2002

(54) PHASE SHIFT MASK AND PHASE SHIFT MASK BLANK

(75) Inventors: Hideaki Mitsui; Osamu Nozawa; Megumi Takeuchi, all of Tokyo (JP)

(73) Assignee: Hoya Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/212,855

(22) Filed: Dec. 17, 1998

(30) Foreign Application Priority Data

Dec. 19, 1997 (JP) .............................. 9-365325

(51) Int. Cl.⁷ .............................. G03F 9/00; C23C 14/34
(52) U.S. Cl. ................. 430/5; 204/192.15; 204/192.22; 204/192.23
(58) Field of Search ....................... 204/192.15, 192.22, 204/192.23; 430/5; 216/12

(56) References Cited

U.S. PATENT DOCUMENTS

| | | | | |
|---|---|---|---|---|
| 5,124,014 A | * | 6/1992 | Foo et al. ............... | 204/192.32 |
| 5,897,976 A | * | 4/1999 | Carcia et al. ............... | 430/5 |
| 5,897,977 A | * | 4/1999 | Carcia et al. ............... | 430/5 |
| 5,939,225 A | * | 8/1999 | Dove et al. ............... | 430/5 |

FOREIGN PATENT DOCUMENTS

| | | | |
|---|---|---|---|
| JP | 5-127361 | 5/1993 | ............. G03F/1/08 |
| JP | 6-250375 | 9/1994 | ............. G03F/1/08 |
| JP | 6250375 | 9/1994 | ............. G03F/1/08 |
| JP | 6-332152 | 12/1994 | ............. G03F/1/08 |
| JP | 7-261370 | 10/1995 | ............. G03F/1/08 |

OTHER PUBLICATIONS

"Thin Film Processes", Vossen et al., pp. 48, Dec. 1978.*

* cited by examiner

*Primary Examiner*—Nam Nguyen
*Assistant Examiner*—Steven H. VerSteeg
(74) *Attorney, Agent, or Firm*—Varndell & Varndell, PLLC

(57) ABSTRACT

The method of manufacturing a halftone phase shift mask blank enables the accurate and easy control over the composition of an MSi semitransparent film that makes it easy to obtain an MSi semitransparent film having a desired specific component, the formation of film with ease at a good reproducibility and the reduction of defects in the layer. A novel process for the production of a halftone type phase shift mask blank adapted for the preparation of a phase shift mask having a semitransparent film formed on a transparent substrate, said semitransparent film being capable of making the phase of light transmitted directly by said semitransparent film different from that of light transmitted by said transparent substrate by a predetermined amount and reducing the intensity of light, characterized in that said semitransparent film is formed using a sputtering target comprising at least one element selected from the group consisting of metal elements and transition metal elements, silicon and at least one compound selected from the group consisting of oxide, nitride and oxinitride of these elements.

18 Claims, 2 Drawing Sheets

PHASE SHIFT MASK AND PHASE SHIFT MASK BLANK

BACKGROUND OF THE INVENTION

1. Field of the Invention

The present invention relates to a phase shift mask for use in the exposure and transfer of a fine pattern and a phase shift mask blank or the like as its parent material. More particularly, the present invention relates to a halftone phase shift mask and a halftone phase shift mask blank or the like.

2. Description of the Related Art

In the art of DRAM (Dynamic Random Access Memory), the trend toward high integration beginning with 1 Mbit has gone so far as to establish a system for the mass production of 64 Mbit and 256 Mbit DRAM's at present. This technological innovation witnessed a tendency toward the use of ultrahigh voltage mercury vapor lamp emitting light having a shorter wavelength, i.e., i-ray (365 nm) instead of g-ray (436 nm), as an exposing light source. The reduction of the wavelength of exposing light is being still considered for further integration. In ordinary photolithographic process, however, the reduction of the wavelength of exposing light causes the reduction of the depth of a focus while improving the resolution. This not only increases the burden on the design of the exposing light system but also remarkably deteriorates the stability of the process, giving an adverse effect on the yield of the product.

A phase shift process is one of ultrahigh resolution pattern transfer processes effective for the solution to the foregoing problems. In the phase shift process, as a mask for use in the transfer of a fine pattern there is used a phase shift mask.

A phase shift mask comprises, e.g., a phase shifter portion having a pattern portion formed on the mask and a non-pattern portion (exposed portion of the substrate) free of phase shifter. The phase of light transmitted by the two portions are shifted by about 180° so that the two light components interfere with each other at the pattern interface to exert an effect of enhancing the contrast of the transferred image. Further, the use of the phase shift process makes it possible to increase the depth of a focus for the necessary resolution. Accordingly, the enhancement of resolution and the expansion of applicability of process can be accomplished at the same time even if light having the same wavelength is used as compared with the conventional transfer process using an ordinary mask having an ordinary light-shielding pattern made of chromium film or the like.

Practically speaking, phase shift masks can be roughly divided into two groups, i.e., completely transparent type (Shibuya-Revenson type) phase shift mask and halftone phase shift mask. In the former type of phase shift mask, the light transmittance of the phase shifter portion is the same as that of the non-pattern portion (exposed portion of the substrate). This mask is almost transparent to the wavelength of the exposing light and thus is generally said to be effective for the transfer of a line-and-space pattern. On the other hand, in the latter type of phase shift mask, the light transmittance of the phase shifter portion is from several percents to scores of percents of that of the non-pattern portion (exposed portion of the substrate). This phase shift mask is said to be effective for the preparation of contact hole or lone pattern in the process for the production of semiconductors.

FIG. 1 is a diagram illustrating the basic structure of a halftone phase shift mask blank. FIG. 2 is a diagram illustrating the basic structure of a halftone phase shift mask. The description of anti-reflection layer or etching stop layer which may be used in lithographic process will be omitted.

The halftone phase shift mask blank comprises a semi-transparent film (halftone phase shifter layer) 2 formed on a transparent substrate 1. The halftone phase shift mask comprises a phase shifter portion 3 having a pattern portion formed on the mask and a non-pattern portion (exposed portion of the substrate) 4 free of phase shifter. The phase shifter portion 3 acts as a phase shifter capable of shifting the phase of exposing light transmitted by the neighborhood of its edge while being capable of substantially shielding the exposing light from the resist formed on the substrate.

Among these halftone phase shift masks is a single layer-type halftone phase shift mask which is simple enough in structure to produce. Examples of such a single layer-type halftone phase shift mask include those having a phase shifter made of a chromium material such as $CrO_x$, $CrN$, $CrO_xN_y$ and $Cr_xON_yC_2$ as described in JP-A-5-127361 (The term "JP-A" as used herein means an "unexamined published Japanese patent application"), those having a phase shifter made of an MoSi material such as MoSiO and MoSiON as described in JP-A-6-332152, and those having a phase shifter made of an SiN or SiO material as described in JP-A-7-261370.

The recent years have witnessed the reduction of the wavelength of exposing light used in the art as well as the trend for more use of halftone phase shift mask. There has recently been a tendency toward the use of krypton fluoride (KrF) exima laser beam (248 nm), which has a wavelength shorter than i-ray. Further, the use of argon fluoride (ArF) exima laser beam (193 nm) or argon chloride (ArCl) exima laser beam (175 nm), which has a wavelength even shorter than i-ray, has been proposed.

With the reduction of the wavelength of exposing light, the corresponding phase shift mask and phase shift mask blank must meet an important requirement, i.e., control over optical coefficients such as transmittance and refractive index in the wavelength of exposing light used. Most substances show remarkably great light absorption in a wavelength range shorter than 250 nm unlike in the wavelength range of from visible light to near ultraviolet. Thus, it is difficult to control the light transmittance of substances to a desired value in this short wavelength range. Thus, a halftone phase shift mask for i-ray cannot be normally used as a halftone phase shift mask for the exposing light having a wavelength range shorter than 250 nm as it is. Referring to the predetermination of the transmittance of the halftone type phase shifter, it is preferred that the transmittance of exposing light can be controlled to a range of from 3 to 20% when the phase shifter has a thickness at which the phase of exposing light can be shifted by a predetermined angle in the case of halftone phase shift mask, though depending on the sensitivity of the resist to be used in the transfer of a pattern or the patterning process.

Another problem is that even if the foregoing basic requirements such as transmittance and refractive index in the wavelength of exposing light can be satisfied to cope with the reduction of the wavelength of exposing light, the transmittance, if it is high with respect to the wavelength of testing light (e.g., 364 nm, 488 nm, 633 nm), cannot be examined, making it impossible to put the mask into practical use. Therefore, it is required that the transmittance of the mask with respect to the wavelength of testing light can be controlled to a desired value to put the mask into practical use.

Further, a halftone phase shift mask and a halftone phase shift mask blank as a parent material from which it is prepared must satisfy some requirements besides the foregoing requirements, i.e., inertness to irradiation with exima laser used (light resistance), chemical durability at cleaning process indispensable for mask process (chemical resistance), minimization of microdefects in the blank that remarkably deteriorate the mask quality (low defect density).

More particularly, the reduction of the wavelength of exposing light is also accompanied by the increase in the density of energy applied per unit time. In this respect, the layer material from which the phase shifter layer is formed must satisfy requirements that it doesn't impair the function of phase shift mask even when damaged by irradiation with light of higher energy. The term "damage" as used herein is meant to indicate change in optical properties (e.g., refractive index, transmittance) of shifter layer, occurrence of color defects, change in layer thickness or deterioration of layer properties by irradiation with light. It is said that when irradiated with exima laser beam having a wavelength in the deep ultraviolet range, the phase shifter layer undergoes two-photon process that excites substances therein, leading to change in the optical properties or other properties of the layer. However, the detail of the mechanism is not yet made clear. Anyway, it is an indispensable condition that the phase shifter layer has a high resistance to irradiation with a high-energy light to cope with the reduction of the wavelength of exposing light.

Taking into account the material of the shifter layer from the standpoint of mask material, the shifter layer must not undergo denaturation or dissolution when cleaned with an acid or alkali at the process for the preparation of mask. In other words, the phase shifter layer must be chemically durable regardless of the wavelength of exposing light.

Further, from the standpoint of the fact that a phase shift mask is a tool for fine work, the halftone phase shift mask blank needs to be workable to a higher precision (e.g., patterning, etching). To this end, the phase shifter layer must be homogeneous and free of defects. It is said that the reduction of the wavelength of exposing light will be accompanied by further rise in the fineness of mask pattern. Thus, defects in the phase shifter layer cause an important problem which governs the reliability of the transfer of pattern.

However, the conventional process for the production of a halftone phase shift mask blank is disadvantageous in that since the satisfaction of the foregoing requirements, if needed to be accomplished by controlling the content of oxygen, nitrogen, etc. in an MSi semitransparent film (M is a metal or transition metal element), is normally accomplished by the employment of a process involving the control over the content of oxygen, nitrogen, etc. in the sputtering gas (i.e., flow ratio in sputtering gas), the required properties can hardly be closely controlled.

In particular, plasma discharge process with oxygen gas (reactive sputtering process) is often liable to abnormal discharge due to insulating oxide formed on the surface of the target. Abnormal discharge occurs on the surface of the target to cause finely divided particles to be scattered. These particles are then taken into the semitransparent film where they act as defects to remarkably deteriorate the quality of the semitransparent film (halftone phase shifter).

Further, the content of oxygen, nitrogen, etc. in the semitransparent film can hardly be closely controlled by adjusting the flow ratio of the sputtering gas. For example, in order to obtain a desired transmittance with an SiN layer, it is necessary that the content of nitrogen be accurately controlled within a narrow range. However, this operation can hardly be effected. Further, this operation has a poor reproducibility.

SUMMARY OF THE INVENTION

The present invention has been worked out under the foregoing circumstances. It is therefore an object of the present invention to provide a process for the production of a halftone phase shift mask blank which enables the accurate and easy control over the composition of an MSi semitransparent film that makes it easy to obtain an MSi semitransparent film having a desired specific component, the formation of film with ease at a good reproducibility and the reduction of defects in the layer.

The foregoing object of the present invention will become more apparent from the following detailed description and examples.

The foregoing object of the present invention is accomplished by the following constitutions.

(Constitution 1) A process for the production of a halftone type phase shift mask blank adapted for the preparation of a phase shift mask having a semitransparent film formed on a transparent substrate, said semitransparent film being capable of making the phase of light transmitted through said semitransparent film different from that of light transmitted directly through said transparent substrate by a predetermined amount and reducing the intensity of light transmitted through semitransparent film, characterized in that said semitransparent film is formed using a sputtering target comprising at least one element selected from the group consisting of metal elements and transition metal elements, silicon and at least one compound selected from the group consisting of oxide, nitride and oxinitride of these elements.

(Constitution 2) The process for the production of a halftone phase shift mask blank according to Constitution 1, wherein said sputtering target comprises nickel, silicon and at least one compound selected from the group consisting of oxide, nitride and oxinitride of these elements.

(Constitution 3) The process for the production of a halftone phase shift mask blank according to Constitution 1, wherein said sputtering target comprises at least one element selected from the group consisting of metal elements and transition metal elements, nickel, silicon and at least one compound selected from the group consisting of oxide, nitride and oxinitride of these elements.

(Constitution 4) The process for the production of a halftone phase shift mask blank according to Constitution 1, wherein said sputtering target comprises at least one element selected from the group consisting of metal elements and transition metal elements, silicon, aluminum and at least one compound selected from the group consisting of oxide, nitride and oxinitride of these elements.

(Constitution 5) The process for the production of a halftone phase shift mask blank according to Constitution 1, wherein said sputtering target comprises at least one element selected from the group consisting of metal elements and transition metal elements, nickel, silicon, aluminum and at least one compound selected from the group consisting of oxide, nitride and oxinitride of these elements.

(Constitution 6) The process for the production of a halftone phase shift mask blank according to Constitution 1, wherein said metal element or transition metal element is at least one element selected from the group consisting of molybdenum, chromium, tungsten, tantalum, cobalt, vanadium, palladium, titanium, niobium, zinc, zirconium, hafnium, germanium, platinum, manganese and iron.

(Constitution 7) The process for the production of a halftone phase shift mask blank according to Constitution 1, wherein said semitransparent film is formed using a mixture of a gas containing at least one element selected from the group consisting of nitrogen, hydrogen and oxygen and an inert gas as a sputtering gas.

(Constitution 8) The process for the production of a halftone phase shift mask blank according to Constitution 1, wherein said sputtering target used has a substantial oxygen content of from 0 to 70 atm % and a substantial nitrogen content of from 0 to 65 atm % and said semitransparent film prepared using said target has an oxygen content of from 0 to 65 atm % and a nitrogen content of from 0 to 60 atm %.

(Constitution 9) The process for the production of a halftone phase shift mask blank according to Constitution 1, wherein the type of discharge to be applied to said sputtering target to produce plasma is any of dc, ac having a frequency of not more than 500 KHz and high frequency wave having a frequency of 13.56 MHz.

(Constitution 10) A process for the production of a halftone phase shift mask, which comprises forming a semitransparent mask pattern to be transferred to a wafer on a transparent substrate using a halftone phase shift mask blank prepared by the process defined in Constitution 1.

(Constitution 11) A process for the production of a halftone phase shift mask, which comprises subjecting a semitransparent film formed on a transparent substrate by the process defined in Constitution 1 to dry etching with a gas containing chlorine and/or gas containing fluorine.

(Constitution 12) A halftone phase shift mask prepared by the process defined in Constitution 10, characterized in that a phase shifter made of said semitransparent film is designed to have a transmittance of from 3 to 20% with respect to desired exposing light having a wavelength of from 150 nm to 370 nm and act as a phase shift mask.

(Constitution 13) A process for the transfer of a pattern, which comprises transferring a pattern using a halftone phase shift mask defined in Constitution 12.

(Constitution 14) The method of manufacturing a halftone phase shift mask blank according to Constitution 1, wherein said sputtering target comprises at least one compound selected from the group consisting of oxide and oxinitride of at least one element selected from the group consisting of metal elements and transition metal elements.

(Constitution 15) The method of manufacturing a halftone phase shift mask blank according to Constitution 14, wherein said sputtering target further comprises at least one compound selected from the group consisting of oxide and oxinitride of silicon.

In accordance with Constitution 1, a process involving the introduction of oxygen and nitrogen into the semitransparent film from the target which has previously comprised oxygen and nitrogen in the form of oxide, nitride and oxinitride of M (M is a metal or transition metal element) or silicon incorporated therein makes it possible to efficiently take oxygen or nitrogen into the layer as compared with the conventional process involving the control over the flow ratio of sputtering gas such as oxygen and nitrogen. Thus, the composition of the semitransparent film can be accurately and easily controlled, making it possible to accurately and easily control the desired properties of the semitransparent film (easily adjust the properties of the semitransparent film to desired values). Further, this process makes it possible to form a film easily at a good reproducibility.

In particular, the foregoing process involves the previous incorporation of oxide in the target that eliminates the necessity of excessive introduction of oxygen as a sputtering gas, making it possible to avoid abnormal discharge and reduce defects in the layer.

Further, the incorporation of silicon in the target makes it practical to prepare an MSi target. In the case, sense silicon act as a binder in the target, it is able to prepare the target practically by sintering, CIP(Cold Isostatic Press) +sintering, or HIP( Hot Isostatic Press). This also makes it easy to prepare an MSi target having a specific composition.

The use of the MSi target having a specific composition makes it possible to prepare a semitransparent film which can satisfy basic requirements such as transmittance and refractive index with respect to the wavelength of exposing light as well as other requirements such as transmittance with respect to the wavelength of exposing light, light resistance, chemical durability (chemical resistance) and low defect density.

In accordance with Constitution 2, as opposed to the problem that an Ni—Si target having a great Ni content, particularly with a specific component, can hardly be prepared, the incorporation of oxygen and nitrogen in the target makes it easy to prepare an Ni—Si target having a specific composition (NiSiO, NiSiN, NiSiON, etc.). A semitransparent film having a specific component prepared using this target having a specific component can satisfy all the foregoing requirements.

In particular, an Ni—Si semitransparent film having a specific composition (NiSiO, NiSiN, NiSiON, etc.) exhibits an excellent controllability over transmittance with respect to the wavelength of testing light. In some detail, a semitransparent film (NiSiO, NiSiN, NiSiON, etc.) having a desired transmittance or refractive index with respect to the wavelength of exposing light (248 nm, 193 nm, etc.) and a desired transmittance with respect to a desired testing light having a wavelength falling within the wavelength range of from 190 nm to 650 nm of testing light can be easily obtained.

In accordance with Constitution 3, the incorporation of M (metal or transition metal element) in the target, in addition to the effect of Constitution 2, allows the metal or transition metal element to act as a binder in the target, making it easy to prepare an Ni—Si target having a specific composition.

Also in accordance with Constitution 3, the incorporation of a metal element and/or transition metal element in the target makes it easy to control and improve the required properties.

In accordance with Constitution 4, the following effect can be exerted in addition to the effects of Constitutions 1 and 3. In other words, aluminum acts similarly to silicon. However, oxides, nitrides and oxinitrides of aluminum can attain a relatively higher refractive index than oxides, nitrides and oxinitrides of silicon. Accordingly, the presence of silicon and aluminum in admixture makes it easy to change the optical coefficients of the phase shift mask and provides a wider control over the optical properties, making it possible to realize desired optical properties.

In accordance with Constitution 5, the effects of Constitutions 2 to 4 can be exerted at the same time.

In accordance with Constitution 6, the use of nickel, silicon and aluminum as the metal element and/or transition metal element M, in addition to the effect of Constitution 1, 3 or 4, not only makes it possible to attain the desired optical properties but also is effective for the enhancement of the electrical properties, optical properties and chemical durability of the layer. In some detail, the electrical properties which can be improved include the electrical conductivity of the layer. The optical properties which can be improved include the controllability over transmittance with respect to the wavelength of exposing light and the transmittance in the wavelength range of testing light for the mask. The chemical durability which can be improved include resistance to the acid or alkali used at the step of cleaning the mask.

In accordance with Constitution 7, the use of a gas containing at least one element selected from the group consisting of nitrogen, hydrogen and oxygen as a sputtering gas, in addition to the use of the target defined in Constitutions 1 to 6, provides a wider control over the required properties, making it possible to further improve the required properties.

In accordance with Constitution 8, if the substantial content of oxygen in the target exceeds 70 atm %, the content of oxygen in the resulting semitransparent film is excessive. If the substantial content of nitrogen in the target exceeds 65 atm %, the content of nitrogen in the resulting semitransparent film is excessive. Further, if the content of oxygen in the semitransparent film exceeds 65%, the transmittance all over the wavelength range rises, making it difficult to examine the layer. In addition, the resistivity of the layer rises or the refractive index of the layer decreases, making it impossible to satisfy the requirements for electrical and optical properties. Moreover, if the content of nitrogen in the semitransparent film exceeds 60 atm %, the transmittance all over the wavelength range rises, making it difficult to examine the layer, as in the oxygen content. In addition, the electrical and optical properties of the layer are deteriorated.

In Constitution 9, a desirable plasma discharge process suitable for the process of the present invention is defined.

In accordance with Constitution 10, the patterning of a blank obtained according to the process of the present invention makes it possible to obtain-a halftone phase shift mask which can satisfy all the requirements.

In accordance with Constitution 11, the combination of a semitransparent film obtained according to the process of the present invention and a dry etching process using a gas containing chlorine and/or a gas containing fluorine makes it possible to attain an excellent precision in fine work.

In accordance with Constitution 12, a halftone phase shift mask having desired optical and other properties can be obtained. In particular, a halftone phase shift mask having desired optical and other properties with respect to exposing light such as krypton fluoride (KrF) exima laser beam (248 nm), argon fluoride (ArF) exima laser beam (193 nm) and argon chloride (ArCl) exima laser beam (175 nm) can be obtained. In accordance with Constitution 13, the transfer of a pattern using a halftone phase shift mask according to the present invention makes it possible to realize a transfer process which can cope with the use of exposing light having a reduced wavelength.

BRIEF DESCRIPTION OF THE DRAWINGS

By way of example and to make the description more clear, reference is made to the accompanying drawings in which.

DESCRIPTION OF THE PREFERRED EMBODIMENTS

Figure 1:
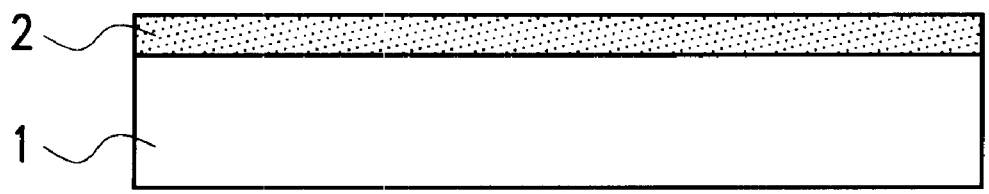
FIG. 1 is a schematic sectional view illustrating a halftone phase shift mask blank.
Figure 2:
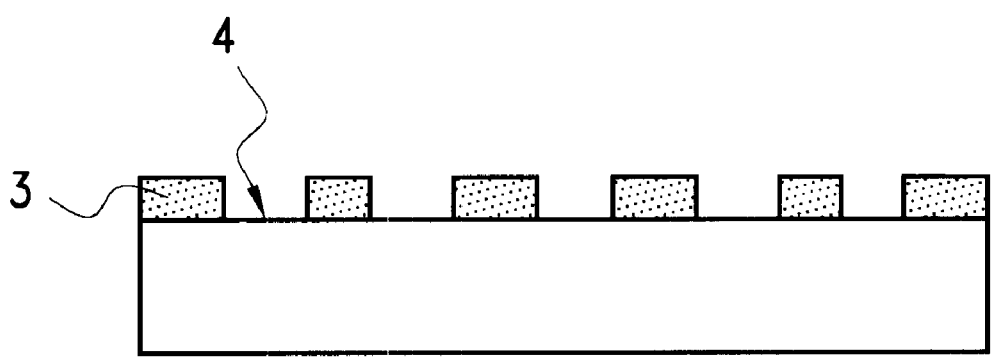
FIG. 2 is a schematic sectional view illustrating a halftone phase shift mask.
Figure 3:
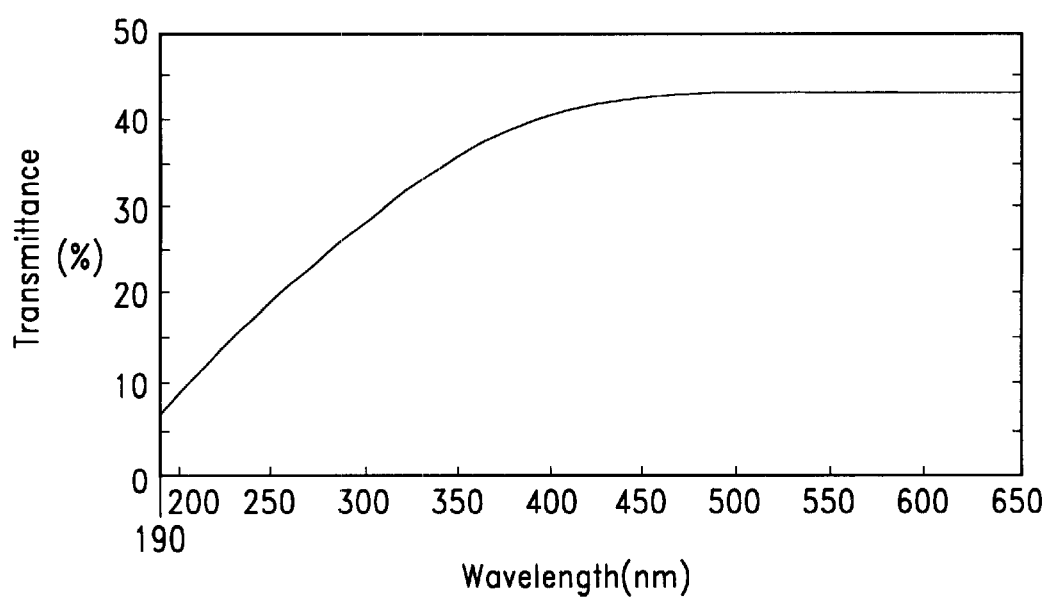
FIG. 3 is a graph illustrating the spectral transmittance of the semitransparent film of Example 3 of the present invention at a wavelength range of from ultraviolet light to visible light, wherein the reference numeral 1 indicates a transparent substrate, the reference numeral 2 indicates a semitransparent film (halftone phase shifter layer), the reference numeral 3 indicates a phase shifter portion, and the reference numeral 4 indicates a non-pattern portion.

The present invention will be further described hereinafter.

Firstly, the process for the production of a halftone phase shift mask blank of the present invention will be described.

In the present invention, as the process for the formation of a semitransparent film (halftone phase shifter layer) there is used a sputtering process.

As the sputtering target there may be used one described above.

Among the main constituent elements of the semitransparent film, nitrogen and oxygen may be previously incorporated in the target from which they are introduced into the semitransparent film.

However, if necessary, a reactive sputtering process using a sputtering gas containing these elements may be effected so that these elements or hydrogen can be additionally introduced into the layer. For example, nitrogen or hydrogen can difficultly cause abnormal discharge during the reactive sputtering process as compared with oxygen and thus may be introduced into the layer via sputtering gas. Examples of the sputtering gas employable herein include nitrogen, oxygen, hydrogen, and gas containing these elements such as nitrogen monoxide, nitrogen dioxide, dinitrogen oxide, laughing gas, ammonia gas, ozone and water. The single or combined use of these gases, optionally in admixture with other gases such as helium, argon and xenon, makes it easy to take nitrogen, oxygen or hydrogen into the layer. Finally, a target composition and a gas composition which can attain the desired layer composition and layer properties may be properly selected.

The type of discharge to be applied to the sputtering target to produce plasma is any of dc, ac having a frequency of not more than 500 KHz and high frequency wave having a frequency of 13.56 MHz.

Preferred among these types of discharge is dc sputtering which has a fast sputtering rate from the standpoint of productivity. In the case of ac discharge process, even if the frequency of ac exceeds 500 KHz, the effect of frequency modulation is not definite on the productivity or quality. In the case of high frequency discharge process, the frequency of the wave is most usually 13.56 MHz.

The sputtering conditions such as sputtering pressure, gas pressure and whether or not the substrate is heated may be properly predetermined according to the material of the semitransparent film or the desired layer composition and properties.

In the case of high frequency discharge process, discharge is made possible regardless of the electrical conductivity of the target. Thus, the ratio of oxide is not limited. In the case of dc discharge process or ac discharge process, oxide may be incorporated in the target in an amount such that the electrical conductivity appropriate for the respective discharge process can be reached. Thus, the incorporation of oxide in the target makes it possible to efficiently introduce oxide into the layer while eliminating abnormal discharge. The incorporation of nitrogen or hydrogen instead of oxygen is effective for the elimination of the possible occurrence of abnormal discharge in plasma during reactive oxygen sputtering and the number of defects in the semitransparent film.

Referring to nitrogen, the incorporation of nitrogen in the target in the form of nitride or oxinitride makes it possible to efficiently introduce nitride into the layer.

The MSi semitransparent film obtained according to the process of the present invention comprises Si incorporated therein to prevent its transmittance from falling at the short wavelength side as opposed to the fact that MO has a wide absorption band about 256 nm.

In order to satisfy all the requirements, it is necessary to select and control the composition of the semitransparent film (constituent elements and their proportion) or the properties of the layer (including binding condition and layer structure). In this manner, the main constituent elements of the semitransparent film can act synergistically, making it possible to satisfy the basic requirements such as transmittance and refractive index with respect to the wavelength of exposing light as well as all the requirements for halftone phase shift mask such as transmittance with respect to the wavelength of testing light, light resistance, chemical durability (chemical resistance) and low defect density.

The action of the various elements in the MSi semitransparent film depends on the kind of the constituent elements and thus cannot be unequivocally described. In practice, however, the various elements act in the NiSi semitransparent film (NiSiO, NiSiN, NiSiON, etc.) or NiSiAl semitransparent film in the manner described hereinafter.

Silicon incorporated in the semitransparent film combines with nitrogen, oxygen and hydrogen incorporated in the same layer to form the main structure of the semitransparent film while producing silicon nitride, silicon oxide and silicon hydride. Thus, the layer structure is strengthened to have an enhanced thermal and chemical stability.

Examples of elements which act similarly to silicon include aluminum. However, oxides, nitrides and oxinitrides of aluminum can attain a relatively higher refractive index than oxides, nitrides and oxinitrides of silicon. Accordingly, the presence of silicon and aluminum in admixture makes it easy to change the optical coefficients of the phase shift mask and provides a wider control over the optical properties, making it possible to realize desired optical properties.

Nitrogen, oxygen and hydrogen incorporated in the layer singly or together cause the change in the properties of halftone phase shifter layer.

Nitrogen in the layer is mainly effective for the change in refractive index in addition to the control over transmittance.

Oxygen in the layer is mainly effective for the control over transmittance. In particular, in order to control the light absorption properties and light transmission properties well-balanced in the ultraviolet range where many materials undergo light absorption to obtain a desired semitransparent film, it is effective to introduce oxygen into the semitransparent film.

However, the introduction of excess oxygen into the layer causes the rise in the ratio of oxide in the layer, possibly resulting in the drop of the refractive index of the semitransparent film. As mentioned above, the phase shift angle is determined by the refractive index and the layer thickness with respect to the wavelength of light. Thus, the drop of refractive index is accompanied by the increase in the layer thickness required to obtain a phase shift angle of 180°. As a result, the desired transmittance (transmission) cannot be obtained. Accordingly, in order to act as a phase shifter with respect to the desired wavelength of exposing light, it is essential for the semitransparent film to not only attain sufficient transmittance but also exhibit a certain refractive index. In order to avoid the drop of refractive index due to the excessive addition of oxygen, it is effective to introduce nitride into the layer and enhance the refractive index of the layer by the addition of nitrogen.

Hydrogen in the layer is effective for the control over transmittance similarly to nitrogen or oxygen as well as the effective termination of dangling bond of the constituent elements of the layer that makes it possible to enhance the stability of the layer to high energy light having a short wavelength such as ultraviolet light.

The amount of hydrogen to be introduced needs to be determined taking into account its thermal and photochemical stability in the layer.

Ni in the layer not only allows the satisfaction of the basic requirements such as transmittance and refractive index with respect to the wavelength of exposing light by proper selection of and control over the composition of the layer containing Ni (constituent elements and their proportion) or the properties of the layer (including binding condition and layer structure) but also is useful to obtain a semitransparent film having a transmittance of not more than 40% with respect to a desired testing light having a wavelength falling within the wavelength range of from 190 nm to 650 nm of testing light.

Further, Ni in the layer, singly or in combination with other metal or transition metal elements, is effective for the enhancement of the electrical properties, optical properties and chemical durability of the layer. In some detail, the electrical properties which can be improved include the electrical conductivity of the layer. The optical properties which can be improved include the controllability over transmittance with respect to the wavelength of exposing light and the transmittance in the wavelength range of testing light for the mask. The chemical durability which can be improved include resistance to the acid or alkali used at the step of cleaning the mask.

As the metal or transition metal element M to be incorporated in the layer there may be properly used a metal or transition metal element which can attain the desired optical properties. In particular, cobalt, tantalum, tungsten, molybdenum, chromium, vanadium, palladium, titanium, niobium, zinc, zirconium, hafnium, germanium, aluminum, platinum, imanganese, iron, etc. are effective for the control over and improvement of the electrical properties, optical properties and chemical durability of the layer.

The semitransparent film is preferably an amorphous structure layer. The amorphousness in the layer structure not only makes it possible to control the stress occurring in the layer to a desired value but also makes it difficult for optical phenomenon deteriorating the transfer properties such as birefringence and scattering to occur. The amorphousness in the layer structure finally makes it possible to remarkably the workability for fine pattern at the lithographic process for the preparation of a mask by patterning.

In order to control the layer structure, it is necessary to predetermine the process and conditions for the formation of layer, the composition of the layer and the target, etc.

The halftone phase shift mask blank according to the present invention may comprise other layers such as anti-reflection layer, etching stop layer and etching mask layer formed thereon as necessary. The transparent substrate may be transparent to exposing light or testing light. The material and other conditions of the transparent substrate are not specifically limited.

The halftone phase shift mask according to the present invention can be obtained by using the halftone phase shift mask blank and patterning the semitransparent film so as to be a pattern to be transferred on a wafer.

The halftone phase shift mask according to the present invention can be obtained by lithographic process. As the lithographic process there may be used one for use in ordinary process for the production of mask. In practice, however, a dry etching process using etching gases such as gas containing fluorine (e.g., $CF_4$, $C_2F_6$, $CHF_3$, $SF_6$, $NF_3$), gas containing chlorine (e.g., $Cl_2$, $CH_2Cl_2$) and gas containing oxygen (e.g., $O_2$, $O_3$, $H_2O$) in proper admixture may be preferably used for the patterning of the semitransparent film of the present invention. In the dry etching process, it is effective to use the foregoing etching gas in admixture with argon, hydrogen, helium or other gases, thereby controlling the etching properties.

The present invention will be further described in the following examples, but the present invention should not be construed as being limited thereto.

EXAMPLE 1

In the present example, a sputtering target prepared from a mixture of silicon, silicon oxide and tantalum at a molar ratio of about 4:3:3 by sintering was used. As a sputtering gas there was used a gas comprising Ar and $N_2$ in admixture at a flow ratio of about 4:6. In this arrangement, a semitransparent film (halftone phase shifter layer) was formed on a quartz substrate by dc sputtering process. For the introduction of the sputtering gas, the pressure in the apparatus during sputtering was adjusted to 3 mTorr by a pressure controller provided directly above the exhaust pump while fixing the total amount of the mixed gas introduced to 30 SCCM. The temperature of the target is at a room temperature and the temperature of the substrate is also same.

The halftone phase shifter layer thus formed on the quartz substrate was the measured for thickness by a contact method and transmittance by a spectrophotometer. As a result, the halftone phase shifter layer exhibited a thickness of 1,010 A and a spectral transmittance of 8.9% at 193 nm. Further, the refractive index (n) of the halftone phase shifter layer was calculated from the reflectance and transmittance of the layer measured by the spectrophotometer and the thickness of the layer. As a result, the refractive index (n) was 1.96, which was confirmed great enough to shift the phase of light having a wavelength of 193 nm by 180° when the layer thickness is 1,010 A.

The halftone phase shifter layer was further measured for spectral transmittance at the wavelength of testing light (364 nm). The result was 54.9%.

For the evaluation of the chemical durability of the halftone phase shifter layer thus prepared, the change of the properties of the layer from before to after dip in an acid was determined. In some detail, the halftone phase shifter layer, which had exhibited a spectral transmittance of 8.9% at 193 nm when the layer thickness is 1,010 A, was dipped in a hot concentrated sulfuric acid which had been heated to a temperature of from 90° C. to 100° C. for 120 minutes, and then measured again for spectral transmittance. As a result, the halftone phase shifter layer exhibited a spectral transmittance of 9.0% at 193 nm when the layer thickness is 1,010 A. Thus, the shift of the phase shift angle caused by dipping in an acid was not more than 1°, demonstrating that the halftone phase shifter layer is sufficiently resistant to hot concentrated sulfuric acid. Similarly, the halftone phase shifter layer was confirmed sufficiently resistant to chemical also when it is dipped in a solution of hydrogen peroxide and sulfuric acid obtained by mixing aqueous hydrogen peroxide and sulfuric acid at a ratio of 1:4 at a temperature of 120° C. for 120 minutes.

For the evaluation of the resistance of the halftone phase shifter layer thus prepared to irradiation with light, the halftone phase shifter layer was irradiated with ArF exima laser beam having an oscillation wavelength of 193 nm. The change of transmittance, refractive index and thickness of the layer from before irradiation were determined. As a result, the halftone phase shifter layer showed no significant change in transmittance, refractive index and layer thickness from before irradiation with ArF exima laser beam having a radiation energy density of 1 $mJ/cm^2$ per unit pulse for $10^7$ pulses, demonstrating that the halftone phase shifter layer has very stable properties.

For the etching of the halftone phase shifter layer thus prepared, a reactive ion etching process was employed. As an etching gas there was used a gas obtained by mixing $CF_4$ and oxygen at a flow ratio of 9:1. As a result, it was confirmed that the halftone phase shifter layer can be fairly etched at an etching selection ratio of about 1.5 with respect to the quartz substrate. Since the layer was amorphous, the pattern developed by etching had a smooth side wall.

As has been described, the preparation of a thin layer which exhibits both excellent layer properties and optical properties as a halftone phase shifter layer can be easily accomplished.

A halftone phase shifter layer which had been prepared in the same manner as above except that the sputtering gas comprised $H_2$ incorporated therein in addition to Ar and $N_2$ (the flow ratio of Ar, $N_2$ and $H_2$ was about 3:6:1) was evaluated in the same manner as mentioned above. As a result, it was confirmed that a halftone phase shifter layer having good properties can be prepared. The halftone phase shifter layer thus prepared exhibited an enhanced transmittance at the wavelength of exposing light while maintaining the desired transmittance at 364 nm, which is the wavelength of testing light for shifter layer.

A halftone phase shifter layer prepared by a high frequency discharge sputtering process using a sputtering target prepared from a mixture of silicon nitride and tantalum oxide at a molar ratio of about 3:2 and Ar as a sputtering gas was evaluated in the same manner as mentioned above. As a result, it was confirmed that a halftone phase shifter layer having good properties can be prepared.

For comparison, a halftone phase shifter layer prepared using a sputtering target free of oxygen prepared from a mixture of silicon and tantalum at a molar ratio of 7:3 and a sputtering gas comprising $O_2$ incorporated therein in addition to Ar and $N_2$ was evaluated in the same manner as mentioned above. As a result, the halftone phase shifter layer thus prepared exhibited a thickness of 1,050 A and a spectral transmittance of 8.6% at 193 nm. Further, the refractive index (n) of the halftone phase shifter layer was calculated from the reflectance and transmittance of the layer measured by the spectrophotometer and the thickness of the layer. As a result, the refractive index (n) was 1.92, demonstrating that the halftone phase shifter layer exhibits desired properties after a fashion. However, when sputtering was effected using an in-line type sputtering apparatus giving a high productivity for a prolonged period of time to form numeral layers, the effect of close variation of flow rate of gas introduced deteriorated the reliability of the layer properties. In other words, the process of the present invention is excellent for the reliability (reproducibility) of layer formation.

If a large-sized substrate is used, the resulting halftone phase shifter layer is liable to scattering of properties. In accordance with the process of the present invention, however, the incorporation of oxygen in the target makes it possible to obtain stably uniform layer properties.

When the amount of oxygen to be added as a gas was increased, some defects were observed occurring in the layer due to abnormal discharge.

The present example has been described with reference to the process involving the formation of a semitransparent film on a quartz substrate. However, the process of the present invention can be applied to a phase shift mask or a phase shift mask blank comprising a halftone phase shifter layer comprising an anti-reflection layer or an etching stop layer provided interposed between the quartz substrate and the semitransparent film, a phase shift mask comprising a Cr light-shielding film and a semitransparent film pattern in admixture on the same transparent substrate, etc.

EXAMPLE 2

In the present example, a sputtering target prepared from a mixture of silicon, silicon oxide and nickel at a molar ratio of about 2:1:1 by sintering was used. As a sputtering gas there was used a gas comprising Ar and $N_2$ in admixture at a flow ratio of about 4:6. In this arrangement, a semitransparent film (halftone phase shifter layer) was formed on a quartz substrate by dc sputtering process. For the introduction of the sputtering gas, the pressure in the apparatus during sputtering was adjusted to 3 mTorr by a pressure controller provided directly above the exhaust pump while fixing the total amount of the mixed gas introduced to 30 SCCM.

The halftone phase shifter layer thus formed on the quartz substrate was the measured for thickness by a contact method and transmittance by a spectrophotometer. As a result, the halftone phase shifter layer exhibited a thickness of 1,025 A and a spectral transmittance of 7.6% at 193 nm. Further, the refractive index (n) of the halftone phase shifter layer was calculated from the reflectance and transmittance of the layer measured by the spectrophotometer and the thickness of the layer. As a result, the refractive index (n) was 1.94, which was confirmed great enough to shift the phase of light having a wavelength of 193 nm by 180° when the layer thickness is 1,025 A.

The halftone phase shifter layer was further measured for spectral transmittance at the wavelength of testing light (364 rn). The result was 34.5%.

For the evaluation of the chemical durability of the halftone phase shifter layer thus prepared, the change of the properties of the layer from before to after dip in an acid was determined. In some detail, the halftone phase shifter layer, which had exhibited a spectral transmittance of 7.6% at 193 nm when the layer thickness is 1,025 A, was dipped in a hot concentrated sulfuric acid which had been heated to a temperature of from 90° C. to 100° C. for 120 minutes, and then measured again for spectral transmittance. As a result, the halftone phase shifter layer exhibited a spectral transmittance of 8.0% at 193 nm when the layer thickness is 1,010 A. Thus, the shift of the phase shift angle caused by dipping in an acid was not more than 2°, demonstrating that the halftone phase shifter layer is sufficiently resistant to hot concentrated sulfuric acid. Similarly, the halftone phase shifter layer was confirmed sufficiently resistant to chemical also when it is dipped in a solution of hydrogen peroxide and sulfuric acid obtained by mixing aqueous hydrogen peroxide and sulfuric acid at a ratio of 1:4 at a temperature of 120° C. for 120 minutes.

For the evaluation of the resistance of the halftone phase shifter layer thus prepared to irradiation with light, the halftone phase shifter layer was irradiated with ArF exima laser beam having an oscillation wavelength of 193 nm. The change of transmittance, refractive index and thickness of the layer from before irradiation were determined. As a result, the halftone phase shifter layer showed no significant change in transmittance, refractive index and layer thickness from before irradiation with ArF exima laser beam having a radiation energy density of 1 mJ/cm$^2$ per unit pulse for $10^7$ pulses, demonstrating that the halftone phase shifter layer has very stable properties.

For the etching of the halftone phase shifter layer thus prepared, a reactive ion etching process was employed. As an etching gas there was used a gas obtained by mixing $Cl_2$ and oxygen at a flow ratio of 18:1. As a result, it was confirmed that the halftone phase shifter layer can be fairly etched at an etching selection ratio of about 7.5 with respect to the quartz substrate. Since the layer was amorphous, the pattern developed by etching had a smooth side wall.

As has been described, the preparation of a thin layer which exhibits both excellent layer properties and optical properties as a halftone phase shifter layer can be easily accomplished.

A halftone phase shifter layer which had been prepared in the same manner as above except that the sputtering gas comprised $H_2$ incorporated therein in addition to Ar and $N_2$ (the flow ratio of Ar, $N_2$ and $H_2$ was about 3:6:1) was evaluated in the same manner as mentioned above. As a result, it was confirmed that a halftone phase shifter layer having good properties can be prepared. The halftone phase shifter layer thus prepared exhibited an enhanced transmittance at the wavelength of exposing light while maintaining the desired transmittance at 364 nm, which is the wavelength of testing light for shifter layer.

A halftone phase shifter layer prepared by a high frequency discharge sputtering process using a sputtering target prepared from a mixture of silicon nitride and nickel oxide at a molar ratio of about 1:1 and Ar as a sputtering gas was evaluated in the same manner as mentioned above. As a result, it was confirmed that a halftone phase shifter layer having good properties can be prepared.

For comparison, a halftone phase shifter layer prepared using a sputtering target free of oxygen and a sputtering gas comprising $O_2$ incorporated therein in addition to Ar and $N_2$ was evaluated in the same manner as mentioned above. As a result, the halftone phase shifter layer thus prepared exhibited a thickness of 1,100 A and a spectral transmittance of 7.1% at 193 nm. Further, the refractive index (n) of the halftone phase shifter layer was calculated from the reflectance and transmittance of the layer measured by the spectrophotometer and the thickness of the layer. As a result, the refractive index (n) was 1.87, demonstrating that the halftone phase shifter layer exhibits desired properties after a fashion. However, when sputtering was effected using an in-line type sputtering apparatus giving a high productivity for a prolonged period of time to form numeral layers, the effect of close variation of flow rate of gas introduced deteriorated the reliability (reproducibility) of the layer properties. In other words, the process of the present invention is excellent for the reliability of layer formation.

When the amount of oxygen to be added as a gas was increased, some defects were observed occurring in the layer due to abnormal discharge.

EXAMPLE 3

In the present example, a sputtering target prepared from a mixture of silicon, silicon oxide, nickel and tantalum at a molar ratio of about 5:2:2:1 by sintering was used. As a sputtering gas there was used a gas comprising Ar and $N_2$ in admixture at a flow ratio of about 4:6. In this arrangement, a semitransparent film (halftone phase shifter layer) was formed on a quartz substrate by dc sputtering process. For the introduction of the sputtering gas, the pressure in the apparatus during sputtering was adjusted to 3 mTorr by a pressure controller provided directly above the exhaust pump while fixing the total amount of the mixed gas introduced to 30 SCCM.

The halftone phase shifter layer thus formed on the quartz substrate was the measured for thickness by a contact method and transmittance by a spectrophotometer. As a result, the halftone phase shifter layer exhibited a thickness of 910 A and a spectral transmittance of 7.3% at 193 nm. Further, the refractive index (n) of the halftone phase shifter layer was calculated from the reflectance and transmittance of the layer measured by the spectrophotometer and the thickness of the layer. As a result, the refractive index (n) was 2.07, which was confirmed great enough to shift the phase of light having a wavelength of 193 nm by 180° when the layer thickness is 910 A.

The halftone phase shifter layer was further measured for spectral transmittance at the wavelength of testing light (364 nm). The result was 37.5%.

For the evaluation of the chemical durability of the halftone phase shifter layer thus prepared, the change of the properties of the layer from before to after dip in an acid was determined as described in the example 1. As a result, the shift of the phase shift angle caused by dipping in an acid was not more than 1°, and the change of the transmittance was not more than 0.2%, demonstrating that the halftone phase shifter layer is sufficiently resistant to chemical.

For the evaluation of the resistance of the halftone phase shifter layer thus prepared to irradiation with light, the halftone phase shifter layer was irradiated with ArF exima laser beam having an oscillation wavelength of 193 nm, same as the example 1. As a result, the halftone phase shifter layer showed no significant change in transmittance, refractive index and layer thickness measured from before irradiation with ArF exima laser beam having a radiation energy density of 1 $mJ/cm^2$ per unit pulse for $10^7$ pulses, demonstrating that the halftone phase shifter layer has very stable properties.

For the etching of the halftone phase shifter layer thus prepared, a reactive ion etching process was employed, same as the Example 1. As an etching gas there was used a gas obtained by mixing $Cl_2$ and oxygen at a flow ratio of 5:1. As a result, it was confirmed that the halftone phase shifter layer can be fairly etched at an etching selection ratio of about 8.5 with respect to the quartz substrate. Since the layer was amorphous, the pattern developed by etching had a smooth side wall.

As has been described above, the preparation of a thin layer which exhibits both excellent layer properties and optical properties as a halftone phase shifter layer can be easily accomplished.

A halftone phase shifter layer prepared by a high frequency discharge sputtering process using a sputtering target prepared from a mixture of silicon nitride, nickel oxide and tantalum oxide at a molar ratio of about 4:2:1 and Ar as a sputtering gas was evaluated in the same manner as mentioned above. As a result, it was confirmed that a halftone phase shifter layer having good properties can be prepared.

For comparison, a halftone phase shifter layer prepared using a sputtering target free of oxygen prepared and a sputtering gas comprising $O_2$ incorporated therein in addition to Ar and $N_2$ was evaluated in the same manner as mentioned above. As a result, the halftone phase shifter layer thus prepared exhibited a thickness of 970 A and a spectral transmittance of 7.2% at 193 nm. Further, the refractive index (n) of the halftone phase shifter layer was calculated from the reflectance and transmittance of the layer measured by the spectrophotometer and the thickness of the layer. As a result, the refractive index (n) was 2.0, demonstrating that the halftone phase shifter layer exhibits desired properties after a fashion. However, the process of the present invention is excellent for occurring an abnormal discharge and some defects in the layer caused by the abnormal discharge caused by increasing the amount of oxygen to be added as a gas, and the reliability (reproducibility) of layer formation.

EXAMPLE 4

In the present example, a sputtering target prepared from a mixture of silicon, silicon oxide, nickel and tantalum at a molar ratio of about 5:2:1:1 by sintering was used. As a sputtering gas there was used a gas comprising Ar, $H_2$ and $N_2$ in admixture at a flow ratio of about 3:6:1. In this arrangement, a semitransparent film (halftone phase shifter layer) was formed on a quartz substrate by dc sputtering process. For the introduction of the sputtering gas, the pressure in the apparatus during sputtering was adjusted to 3 mTorr by a pressure controller provided directly above the exhaust pump while fixing the total amount of the mixed gas introduced to 30 SCCM.

The halftone phase shifter layer thus formed on the quartz substrate was the measured for thickness by a contact method and transmittance by a spectrophotometer. As a result, the halftone phase shifter layer exhibited a thickness of 1040 A and a spectral transmittance of 10.5% at 193 nm. Further, the refractive index (n) of the halftone phase shifter layer was calculated from the reflectance and transmittance of the layer measured by the spectrophotometer and the thickness of the layer. As a result, the refractive index (n) was 1.93, which was confirmed great enough to shift the phase of light having a wavelength of 193 nm by 180° when the layer thickness is 1040 A.

The halftone phase shifter layer was further measured for spectral transmittance at the wavelength of testing light (364 nm). The result was 39.8%.

For the evaluation of the chemical durability of the halftone phase shifter layer thus prepared, the change of the properties of the layer from before to after dip in an acid was determined as described in the example 1. As a result, the shift of the phase shift angle caused by dipping in an acid was not more than 1°, and the change of the transmittance was not more than 0.4%, demonstrating that the halftone phase shifter layer is sufficiently resistant to chemical.

For the evaluation of the resistance of the halftone phase shifter layer thus prepared to irradiation with light, the halftone phase shifter layer was irradiated with ArF exima laser beam having an oscillation wavelength of 193 nm, same as the example 1. As a result, the halftone phase shifter layer showed no significant change in transmittance, refractive index and layer thickness measured from before irradiation with ArF exima laser beam having a radiation energy density of 1 $mJ/cm^2$ per unit pulse for $10^7$ pulses, demonstrating that the halftone phase shifter layer has very stable properties.

For the etching of the halftone phase shifter layer thus prepared, a reactive ion etching process was employed, same as the Example 1. As an etching gas there was used a gas obtained by mixing $Cl_2$ and oxygen at a flow ratio of 9:1. As a result, it was confirmed that the halftone phase shifter layer can be fairly etched at an etching selection ratio of about 10 with respect to the quartz substrate. Since the layer was amorphous, the pattern developed by etching had a smooth side wall.

As has been described above, the preparation of a thin layer which exhibits both excellent layer properties and optical properties as a halftone phase shifter layer can be easily accomplished.

A halftone phase shifter layer prepared by a high frequency discharge sputtering process using a sputtering target prepared from a mixture of silicon nitride, nickel oxide and tantalum oxide at a molar ratio of about 4:2:1 and a gas obtained by mixing Ar and $H_2$ at a flow ratio of 9:1, as a sputtering gas, was evaluated in the same manner as mentioned above. As a result, it was confirmed that a halftone phase shifter layer having good properties can be prepared. The halftone phase shifter layer thus prepared exhibited an enhanced transmittance at the wavelength of exposing light while maintaining the desired transmittance at 364 nm, which is the wavelength of testing light for shifter layer.

For comparison, a halftone phase shifter layer prepared using a sputtering target free of oxygen prepared and a sputtering gas comprising $O_2$ incorporated therein in addition to Ar, $N_2$ and $H_2$ was evaluated in the same manner as mentioned above. As a result, the halftone phase shifter layer thus prepared exhibited a thickness of 1085 A and a spectral transmittance of 9.9% at 193 nm. Further, the refractive index (n) of the halftone phase shifter layer was calculated from the reflectance and transmittance of the layer measured by the spectrophotometer and the thickness of the layer. As a result, the refractive index (n) was 1.89, demonstrating that the halftone phase shifter layer exhibits desired properties after a fashion. However, since it is required for the process to apply $N_2$ and $H_2$ simultaneously, it is difficult to change the condition of applying a gas in a wide range sufficiently. As a result the halftone phase shifter layer can be formed on a narrow range of the condition only.

Some defects in the layer caused by the abnormal discharge caused are detected. Further the sufficient reliability (reproducibility) of layer formation is not obtained.

EXAMPLE 5

In the present example, a sputtering target prepared from a mixture of silicon, silicon oxide, nickel and molybdenum at a molar ratio of about 4:2:1:2 by sintering was used. As a sputtering gas there was used a gas comprising Ar and $N_2$ in admixture at a flow ratio of about 4:6. In this arrangement, a semitransparent film (halftone phase shifter layer) was formed on a quartz substrate by dc sputtering process. For the introduction of the sputtering gas, the pressure in the apparatus during sputtering was adjusted to 3 mTorr by a pressure controller provided directly above the exhaust pump while fixing the total amount of the mixed gas introduced to 30 SCCM.

The halftone phase shifter layer thus formed on the quartz substrate was the measured for thickness by a contact method and transmittance by a spectrophotometer. As a result, the halftone phase shifter layer exhibited a thickness of 1060 A and a spectral transmittance of 4.3% at 193 nm. Further, the refractive index (n) of the halftone phase shifter layer was calculated from the reflectance and transmittance of the layer measured by the spectrophotometer and the thickness of the layer. As a result, the refractive index (n) was 1.92, which was confirmed great enough to shift the phase of light having a wavelength of 193 nm by 180° when the layer thickness is 1060 A.

The halftone phase shifter layer was further measured for spectral transmittance at the wavelength of testing light (364 nm). The result was 35.1%.

For the evaluation of the chemical durability of the halftone phase shifter layer thus prepared, the change of the properties of the layer from before to after dip in an acid was determined as described in the example 1. As a result, the shift of the phase shift angle caused by dipping in an acid was not more than 1.2°, and the change of the transmittance was not more than 0.2%, demonstrating that the halftone phase shifter layer is sufficiently resistant to chemical.

For the evaluation of the resistance of the halftone phase shifter layer thus prepared to irradiation with light, the halftone phase shifter layer was irradiated with ArF exima laser beam having an oscillation wavelength of 193 nm, same as the example 1. As a result, the halftone phase shifter layer showed no significant change in transmittance, refractive index and layer thickness measured from before irradiation with ArF exima laser beam having a radiation energy density of 1 $mJ/cm^2$ per unit pulse for $10^7$ pulses, demonstrating that the halftone phase shifter layer has very stable properties.

For the etching of the halftone phase shifter layer thus prepared, a reactive ion etching process was employed. As an etching gas there was used a gas obtained by mixing $Cl_2$, $O_2$ and $SF_6$ at a flow ratio of 6:2:3. As a result, it was confirmed that the halftone phase shifter layer can be fairly etched at an etching selection ratio of about 10 with respect to the quartz substrate. Since the layer was amorphous, the pattern developed by etching had a smooth side wall.

As has been described above, the preparation of a thin layer which exhibits both excellent layer properties and optical properties as a halftone phase shifter layer can be easily accomplished.

Further a halftone phase shifter layer prepared using a sputtering gas comprising $H_2$ incorporated therein in addition to Ar, $N_2$ (the flow ratio of Ar, $N_2$ and $H_2$ was about 3:6:1) was evaluated in the same manner as mentioned above. As a result, the halftone phase shifter layer thus prepared exhibited a thickness of 1120 A and a spectral transmittance of 6.1% at 193 nm, and the refractive index (n) was 1.86, which was confirmed great enough to shift the phase of light having a wavelength of 193 nm by 180° when the layer thickness is 1,120 A.

The spectral transmittance at the wavelength of testing light (364 nm) was 37.9%. The halftone phase shifter layer thus prepared exhibited an enhanced transmittance at the wavelength of exposing light while maintaining the desired transmittance at 364 nm, which is the wavelength of testing light for shifter layer.

A halftone phase shifter layer prepared by a high frequency discharge sputtering process using a sputtering target prepared from a mixture of silicon nitride, nickel oxide and molybdenum oxide at a molar ratio of about 2:1:2 and a gas obtained by mixing Ar and $H_2$ at a flow ratio of 9:1, as a sputtering gas, was evaluated in the same manner as mentioned above. As a result, it was confirmed that a halftone phase shifter layer having good properties can be prepared.

For comparison, a halftone phase shifter layer prepared using a sputtering target free of oxygen prepared and a sputtering gas comprising $O_2$ incorporated therein in addition to Ar, $N_2$ and $H_2$ was evaluated in the same manner as mentioned above. As a result, the halftone phase shifter layer thus prepared exhibited a thickness of 1095 A and a spectral transmittance of 3.9% at 193 nm. Further, the refractive index (n) of the halftone phase shifter layer was calculated from the reflectance and transmittance of the layer measured by the spectrophotometer and the thickness of the layer. As a result, the refractive index (n) was 1.88, demonstrating that the halftone phase shifter layer exhibits desired properties after a fashion. However, the process of the present invention is excellent for occurring an abnormal discharge and some defects in the layer caused by the abnormal discharge caused by increasing the amount of oxygen to be added as a gas, and the reliability (reproducibility) of layer formation.

EXAMPLE 6

In the present example, a sputtering target prepared from a mixture of silicon, silicon oxide, aluminum and tantalum at a molar ratio of about 1:4:2:3 by sintering was used. As a sputtering gas there was used a gas comprising Ar and $N_2$ in admixture at a flow ratio of about 2:3. In this arrangement, a semitransparent film (halftone phase shifter layer) was formed on a quartz substrate by dc sputtering process. For the introduction of the sputtering gas, the pressure in the apparatus during sputtering was adjusted to 3 mTorr by a pressure controller provided directly above the exhaust pump while fixing the total amount of the mixed gas introduced to 30 SCCM.

The halftone phase shifter layer thus formed on the quartz substrate was the measured for thickness by a contact method and transmittance by a spectrophotometer. As a result, the halftone phase shifter layer exhibited a thickness of 1120 A and a spectral transmittance of 13.0% at 193 nm. Further, the refractive index (n) of the halftone phase shifter layer was calculated from the reflectance and transmittance of the layer measured by the spectrophotometer and the thickness of the layer. As a result, the refractive index (n) was 1.88, which was confirmed great enough to shift the phase of light having a wavelength of 193 nm by 180° when the layer thickness is 1120 A.

The halftone phase shifter layer was further measured for spectral transmittance at the wavelength of testing light (364 nm). The result was 64.4%.

For the evaluation of the chemical durability of the halftone phase shifter layer thus prepared, the change of the properties of the layer from before to after dip in an acid was determined. In some detail, the halftone phase shifter layer, which had exhibited a spectral transmittance of 13.0% at 193 nm when the layer thickness is 1,120 A, was dipped in a hot concentrated sulfuric acid which had been heated to a temperature of from 90° C. to 100° C. for 120 minutes, and then measured again for spectral transmittance. As a result, the halftone phase shifter layer exhibited a spectral transmittance of 13.4% at 193 nm when the layer thickness is 1,100 A. Thus, the shift of the phase shift angle caused by dipping in an acid was not more than 1.0°, demonstrating that the halftone phase shifter layer is sufficiently resistant to hot concentrated sulfuric acid. Similarly, the halftone phase shifter layer was confirmed sufficiently resistant to chemical also when it is dipped in a solution of hydrogen peroxide and sulfuric acid obtained by mixing aqueous hydrogen peroxide and sulfuric acid at a ratio of 1:4 at a temperature of 120° C. for 120 minutes.

For the evaluation of the resistance of the halftone phase shifter layer thus prepared to irradiation with light, the halftone phase shifter layer was irradiated with ArF exima laser beam having an oscillation wavelength of 193 nm. As a result, the halftone phase shifter layer showed no significant change in transmittance, refractive index and layer thickness measured from before irradiation with ArF exima laser beam having a radiation energy density of 1 mJ/cm² per unit pulse for $10^7$ pulses, demonstrating that the halftone phase shifter layer has very stable properties.

For the etching of the halftone phase shifter layer thus prepared, a reactive ion etching process was employed. As an etching gas there was used a gas obtained by mixing $SF_6$ and $O_2$ at a flow ratio of 8:1. As a result, it was confirmed that the halftone phase shifter layer can be fairly etched at an etching selection ratio of about 12 with respect to the quartz substrate. Since the layer was amorphous, the pattern developed by etching had a smooth side wall.

As has been described above, the preparation of a thin layer which exhibits both excellent layer properties and optical properties as a halftone phase shifter layer can be easily accomplished.

Further a halftone phase shifter layer prepared using a sputtering gas comprising $H_2$ incorporated therein in addition to Ar, $N_2$ (the flow ratio of Ar, $N_2$ and $H_2$ was about 3:6:1)was evaluated in the same manner as mentioned above. As a result, the halftone phase shifter layer thus prepared exhibited an enhanced transmittance at the wavelength of exposing light while maintaining the desired transmittance at 364 nm, which is the wavelength of testing light for shifter layer.

A halftone phase shifter layer prepared by a high frequency discharge sputtering process using a sputtering target prepared from a mixture of silicon nitride, aluminum oxide and tantalum oxide at a molar ratio of about 2:1:2 and a gas obtained by mixing Ar, as a sputtering gas, was evaluated in the same manner as mentioned above. As a result, it was confirmed that a halftone phase shifter layer having good properties can be prepared.

For comparison, a halftone phase shifter layer prepared using a sputtering target free of oxygen prepared and a sputtering gas comprising $O_2$ incorporated therein in addition to Ar, $N_2$ and $H_2$ was evaluated in the same manner as mentioned above. As a result, the halftone phase shifter layer thus prepared exhibited a thickness of 960 A and a spectral transmittance of 13.2% at 193 nm. Further, the refractive index (n) of the halftone phase shifter layer was calculated from the reflectance and transmittance of the layer measured by the spectrophotometer and the thickness of the layer. As a result, the refractive index (n) was 2.01, demonstrating that the halftone phase shifter layer exhibits desired properties after a fashion. However, the process of the present invention is excellent for occurring an abnormal discharge and some defects in the layer caused by the abnormal discharge caused by increasing the amount of oxygen to be added as a gas, and the reliability (reproducibility) of layer formation.

EXAMPLE 7

In the present example, a sputtering target prepared from a mixture of silicon, silicon oxide, nickel and aluminum at a molar ratio of about 4:1:3:2 by sintering was used. As a sputtering gas there was used a gas comprising Ar and $N_2$ in admixture at a flow ratio of about 4:6. In this arrangement, a semitransparent film (halftone phase shifter layer) was formed on a quartz substrate by dc sputtering process. For the introduction of the sputtering gas, the pressure in the apparatus during sputtering was adjusted to 3 mTorr by a pressure controller provided directly above the exhaust pump while fixing the total amount of the mixed gas introduced to 30 SCCM.

The halftone phase shifter layer thus formed on the quartz substrate was the measured for thickness by a contact method and transmittance by a spectrophotometer. As a result, the halftone phase shifter layer exhibited a thickness of 870 A and a spectral transmittance of 7.4% at 193 nm. Further, the refractive index (n) of the halftone phase shifter layer was calculated from the reflectance and transmittance of the layer measured by the spectrophotometer and the thickness of the layer. As a result, the refractive index (n) was 2.11, which was confirmed great enough to shift the phase of light having a wavelength of 193 nm by 180° when the layer thickness is 870 A.

The halftone phase shifter layer was further measured for spectral transmittance at the wavelength of testing light (364 nm). The result was 34.2%.

For the evaluation of the chemical durability of the halftone phase shifter layer thus prepared, the change of the properties of the layer from before to after dip in an acid was determined. As a result, the shift of the phase shift angle caused by dipping in an acid was not more than 2.0° and the change of the transmittance was not more than 0.6%, demonstrating that the halftone phase shifter layer is sufficiently resistant to chemical solution.

For the evaluation of the resistance of the halftone phase shifter layer thus prepared to irradiation with light, the halftone phase shifter layer was irradiated with ArF exima laser beam having an oscillation wavelength of 193 nm. As a result, the halftone phase shifter layer showed no significant change in transmittance, refractive index and layer thickness measured from before irradiation with ArF exima laser beam having a radiation energy density of 1 mJ/cm$^2$ per unit pulse for $10^7$ pulses, demonstrating that the halftone phase shifter layer has very stable properties.

For the etching of the halftone phase shifter layer thus prepared, a reactive ion etching process was employed. As an etching gas there was used a gas obtained by mixing $Cl_2$ and $_o2$ at a flow ratio of 6:1. As a result, it was confirmed that the halftone phase shifter layer can be fairly etched at an etching selection ratio of about 8 with respect to the quartz substrate. Since the layer was amorphous, the pattern developed by etching had a smooth side wall.

As has been described above, the preparation of a thin layer which exhibits both excellent layer properties and optical properties as a halftone phase shifter layer can be easily accomplished.

A halftone phase shifter layer prepared by a high frequency discharge sputtering process using a sputtering target prepared from a mixture of silicon nitride, Nickel oxide and aluminum oxide at a molar ratio of about 2:3:1 and a gas obtained by mixing Ar, as a sputtering gas, was evaluated in the same manner as mentioned above. As a result, it was confirmed that a halftone phase shifter layer having good properties can be prepared.

For comparison, a halftone phase shifter layer prepared using a sputtering target free of oxygen prepared and a sputtering gas comprising $O_2$ incorporated therein in addition to Ar, $N_2$ and $H_2$ was evaluated in the same manner as mentioned above. As a result, the halftone phase shifter layer thus prepared exhibited a thickness of 890 A and a spectral transmittance of 7.0% at 193 nm. Further, the refractive index (n) of the halftone phase shifter layer was calculated from the reflectance and transmittance of the layer measured by the spectrophotometer and the thickness of the layer. As a result, the refractive index (n) was 2.09, demonstrating that the halftone phase shifter layer exhibits desired properties after a fashion. However, the process of the present invention is excellent for occurring an abnormal discharge and some defects in the layer caused by the abnormal discharge caused by increasing the amount of oxygen to be added as a gas, and the reliability (reproducibility) of layer formation.

EXAMPLE 8

In the present example, a sputtering target prepared from a mixture of silicon, silicon oxide, nickel and aluminum at a molar ratio of about 4:1:3:2 by sintering was used. As a sputtering gas there was used a gas comprising Ar, $N_2$ and $H_2$ in admixture at a flow ratio of about 3:6:1. In this arrangement, a semitransparent film (halftone phase shifter layer) was formed on a quartz substrate by dc sputtering process. For the introduction of the sputtering gas, the pressure in the apparatus during sputtering was adjusted to 3 mTorr by a pressure controller provided directly above the exhaust pump while fixing the total amount of the mixed gas introduced to 30 SCCM.

The halftone phase shifter layer thus formed on the quartz substrate was the measured for thickness by a contact method and transmittance by a spectrophotometer. As a result, the halftone phase shifter layer exhibited a thickness of 960 A and a spectral transmittance of 9.0% at 193 nm. Further, the refractive index (n) of the halftone phase shifter layer was calculated from the reflectance and transmittance of the layer measured by the spectrophotometer and the thickness of the layer. As a result, the refractive index (n) was 2.00, which was confirmed great enough to shift the phase of light having a wavelength of 193 nm by 180° when the layer thickness is 960 A.

The halftone phase shifter layer was further measured for spectral transmittance at the wavelength of testing light (364 nm) The result was 36.3%.

For the evaluation of the chemical durability of the halftone phase shifter layer thus prepared, the change of the properties of the layer from before to after dip in an acid was determined. As a result, the shift of the phase shift angle caused by dipping in an acid was not more than 1.5° and the change of the transmittance was not more than 0.7%, demonstrating that the halftone phase shifter layer is sufficiently resistant to chemical solution.

For the evaluation of the resistance of the halftone phase shifter layer thus prepared to irradiation with light, the half tone phase shifter layer was irradiated with ArF exima laser beam having an oscillation wavelength of 193 nm. As a result, the halftone phase shifter layer showed no significant change in transmittance, refractive index and layer thickness measured from before irradiation with ArF exima laser beam having a radiation energy density of 1 mJ/cm$^2$ per unit pulse for $10^7$ pulses, demonstrating that the halftone phase shifter layer has very stable properties.

For the etching of the halftone phase shifter layer thus prepared, a reactive ion etching process was employed. As an etching gas there was used a gas obtained by mixing $Cl_2$ and $O_2$ at a flow ratio of 5:1. As a result, it was confirmed that the halftone phase shifter layer can be fairly etched at an etching selection ratio of about 7.5 with respect to the quartz substrate. Since the layer was amorphous, the pattern developed by etching had a smooth side wall.

As has been described above, the preparation of a thin layer which exhibits both excellent layer properties and optical properties as a halftone phase shifter layer can be easily accomplished.

A halftone phase shifter layer prepared by a high frequency discharge sputtering process using a sputtering target prepared from a mixture of silicon nitride, Nickel oxide and aluminum oxide at a molar ratio of about 2:3:1 and a gas obtained by mixing Ar, as a sputtering gas, was evaluated in the same manner as mentioned above. As a result, it was confirmed that a halftone phase shifter layer having good properties can be prepared. The halftone phase shifter layer thus prepared exhibited an enhanced transmittance at the wavelength of exposing light while maintaining the desired transmittance at 364 nm, which is the wavelength of testing light for shifter layer.

For comparison, a halftone phase shifter layer prepared using a sputtering target free of oxygen prepared and a sputtering gas comprising $O_2$ incorporated therein in addition to Ar, $N_2$ and $H_2$ was evaluated in the same manner as mentioned above. As a result, the halftone phase shifter layer thus prepared exhibited a thickness of 910 A and a spectral transmittance of 8.4% at 193 nm. Further, the refractive index (n) of the halftone phase shifter layer was calculated from the reflectance and transmittance of the layer measured by the spectrophotometer and the thickness of the layer. As a result, the refractive index (n) was 2.06, demonstrating that the halftone phase shifter layer exhibits desired properties after a fashion. However, since it is required for the process to apply $H_2$ and $O_2$ simultaneously, it is difficult to change the condition of applying a gas in a wide range sufficiently. As a result the halftone phase shifter layer can be formed on a narrow range of the condition only.

Some defects in the layer caused by the abnormal discharge caused are detected. Further the sufficient reliability (reproducibility) of layer formation is not obtained.

EXAMPLE 9

In the present example, except for using cobalt, tungsten and chromium instead of tantalum, and controlling the sputtering target and gas composition, an evaluation is performed in the same manner as mentioned in the examples 1, 3, 4, and 6. As a result, in the same manner as mentioned in the examples 5 to 7, it was confirmed that a halftone phase shifter layer having good layer properties and optical properties can be prepared.

EXAMPLE 10

In the present example, a sputtering target prepared from a mixture of silicon, silicon oxide, chromium at a molar ratio of about 5:3:2 by sintering was used. As a sputtering gas there was used a gas comprising Ar and $N_2$ in admixture at a flow ratio of about 4:6. In this arrangement, a semitransparent film (halftone phase shifter layer) was formed on a quartz substrate by dc sputtering process. For the introduction of the sputtering gas, the pressure in the apparatus during sputtering was adjusted to 3 mTorr by a pressure controller provided directly above the exhaust pump while fixing the total amount of the mixed gas introduced to 30 SCCM.

The halftone phase shifter layer thus formed on the quartz substrate was the measured for thickness by a contact method and transmittance by a spectrophotometer. As a result, the halftone phase shifter layer exhibited a thickness of 920 A and a spectral transmittance of 4.0% at 193 nm. Further, the refractive index (n) of the halftone phase shifter layer was calculated from the reflectance and transmittance of the layer measured by the spectrophotometer and the thickness of the layer. As a result, the refractive index (n) was 2.05, which was confirmed great enough to shift the phase of light having a wavelength of 193 nm by 180° when the layer thickness is 920 A.

The halftone phase shifter layer was further measured for spectral transmittance at the wavelength of testing light (364 nm). The result was 39.6%.

For the evaluation of the chemical durability of the halftone phase shifter layer thus prepared, the change of the properties of the layer from before to after dip in an acid was determined. In some detail, the halftone phase shifter layer, which had exhibited a spectral transmittance of 4.0% at 193 nm when the layer thickness is 920 A, was dipped in a hot concentrated sulfuric acid which had been heated to a temperature of from 90° C. to 100° C. for 120 minutes, and then measured again for spectral transmittance. As a result, the halftone phase shifter layer exhibited a spectral transmittance of 4.2% at 193 nm when the layer thickness is 910 A. Thus, the shift of the phase shift angle caused by dipping in an acid was not more than 1.0°, demonstrating that the halftone phase shifter layer is sufficiently resistant to hot concentrated sulfuric acid. Similarly, the halftone phase shifter layer was confirmed sufficiently resistant to chemical also when it is dipped in a solution of hydrogen peroxide and sulfuric acid obtained by mixing aqueous hydrogen peroxide and sulfuric acid at a ratio of 1:4 at a temperature of 120° C. for 120 minutes.

For the evaluation of the resistance of the halftone phase shifter layer thus prepared to irradiation with light, the halftone phase shifter layer was irradiated with ArF exima laser beam having an oscillation wavelength of 193 nm. As a result, the halftone phase shifter layer showed no significant change in transmittance, refractive index and layer thickness measured from before irradiation with ArF exima laser beam having a radiation energy density of 1 $mJ/cm^2$ per unit pulse for $10^7$ pulses, demonstrating that the halftone phase shifter layer has very stable properties.

For the etching of the halftone phase shifter layer thus prepared, a reactive ion etching process was employed. As an etching gas there was used a gas obtained by mixing $Cl_2$ and $O_2$ at a flow ratio of 17:1. As a result, it was confirmed that the halftone phase shifter layer can be fairly etched at an etching selection ratio of about 7.8 with respect to the quartz substrate. Since the layer was amorphous, the pattern developed by etching had a smooth side wall.

As has been described above, the preparation of a thin layer which exhibits both excellent layer properties and optical properties as a halftone phase shifter layer can be easily accomplished.

A halftone phase shifter layer prepared by a high frequency discharge sputtering process using a sputtering target comprising a nitride of silicon and chromium, or oxinitride of silicon and chromium and a gas obtained by mixing Ar, as a sputtering gas, was evaluated in the same manner as mentioned above. As a result, it was confirmed that a halftone phase shifter layer having good properties can be prepared.

Further a halftone phase shifter layer prepared using a sputtering gas comprising $H_2$ incorporated therein in addition to Ar, $N_2$ (the flow ratio of Ar, $N_2$ and $H_2$ was about 3:6:1) was evaluated in the same manner as mentioned above. As a result, the halftone phase shifter layer thus prepared exhibited a thickness of 980 A and a spectral transmittance of 4.9% at 193 nm, and the refractive index (n) was 1.99, which was confirmed great enough to shift the phase of light having a wavelength of 193 nm by 180° when the layer thickness is 980 A.

The spectral transmittance at the wavelength of testing light (364 nm) was 40.7%.

For comparison, a halftone phase shifter layer prepared using a sputtering target free of oxygen prepared and a sputtering gas comprising $O_2$ incorporated therein in addition to Ar and $N_2$ was evaluated in the same manner as mentioned above. As a result, the halftone phase shifter layer thus prepared exhibited a thickness of 1010 A and a spectral transmittance of 3.8% at 193 nm. Further, the refractive index (n) of the halftone phase shifter layer was calculated from the reflectance and transmittance of the layer measured by the spectrophotometer and the thickness of the layer. As a result, the refractive index (n) was 1.95, demonstrating that the halftone phase shifter layer exhibits desired properties after a fashion. However, the process of the present invention is excellent for occurring an abnormal discharge and some defects in the layer caused by the abnormal discharge caused by increasing the amount of oxygen to be added as a gas, and the reliability (reproducibility) of layer formation.

While the invention has been described in detail and with reference to specific embodiments thereof, it will be apparent to one skilled in the art that various changes and modifications can be made therein without departing from the spirit and scope thereof.

For example, in the present example, in order to effect dc sputtering, it is necessary that the sputtering target have some electrical conductivity. However, if the material constituting the target can hardly undergo dc discharge like semi-insulating material or non-conducting material, the target may comprise a material rendering the target electrically conductive such as boron incorporated therein in a slight amount so far as the properties of the eventually formed halftone phase shifter layer are not impaired. On the contrary, if the target material has an excellent electrical conductivity, the target may comprise an insulating material or a semiconductor material incorporated therein so far as discharge properties and layer properties are not impaired. As the discharge process there may be substantially employed a high frequency discharge process or ac discharge process which can hardly be affected by the electrical conductivity of the target to produce plasma besides dc discharge process. In any case, however, it is important to minimize defects in the layer during the preparation of the desired layer.

The gas to be used in sputtering is not limited to the present example in its component and mixing ratio. For example, another inert gas such as Xe gas or He gas may be used instead of Ar gas. A gas containing nitrogen such as $NH_3$, $N_2O$ and NO may be used $N_2$ gas. Alternatively, gases containing these components may be properly selected and mixed for use.

Further, the etching of the phase shifter layer is not limited to the process described in the present example. For example, etching process, etching gas and detailed etching conditions may be optimally predetermined.

As the transparent substrate there may be used a substrate made of fluorite or any of other various glass substrates (e.g., fluorophosphoric acid glass, fluoroboric acid glass) instead of quartz substrate.

As mentioned above, the process for the production of a halftone phase shift mask blank of the present invention enables the accurate and easy control over the composition of an MSi semitransparent film that makes it easy to obtain an MSi semitransparent film having a desired specific component, the formation of film with ease at a good reproducibility and the reduction of defects in the layer.

What is claimed is:

1. A method of manufacturing a halftone phase shift mask blank adapted for the preparation of a phase shift mask comprising the steps of forming a semitransparent film on a transparent substrate, said semitransparent film being capable of making the phase of light transmitted through said semitransparent film different from that of light transmitted directly through said transparent substrate by a predetermined amount and reducing an intensity of light transmitted through said semitransparent film, wherein the step of forming said semitransparent film comprises a sputtering step using a sputtering target material comprising an element and a compound, said element is selected from the group consisting of metal elements and silicon; and said compound is selected from the group consisting of oxide, nitride and oxinitride of said metal elements and silicon.

2. The method of manufacturing a halftone phase shift mask blank according to claim 1, wherein said element of said sputtering target material includes nickel and silicon; and said compound of said sputtering target material is selected from the group consisting of oxide, nitride and oxinitride of nickel and silicon.

3. The method of manufacturing a halftone phase shift mask blank according to claim 1, wherein said element of said sputtering target material includes nickel, a metal element other than nickel, and silicon; and said compound of said sputtering target material is selected from the group consisting of oxide, nitride and oxinitride of nickel, metal elements other than nickel, and silicon.

4. The method of manufacturing a halftone phase shift mask blank according to claim 3, wherein said metal elements other than nickel are transition metal elements.

5. The method of manufacturing a halftone phase shift mask blank according to claim 1, wherein said element of said sputtering target material includes aluminum, a metal element other than aluminum, and silicon; and said compound of said sputtering target material is selected from the group consisting of oxide, nitride and oxinitride of aluminum, metal elements other than aluminum, and silicon.

6. The method of manufacturing a halftone phase shift mask blank according to claim 5, wherein said metal elements other than aluminum are transition metal elements.

7. The method of manufacturing a halftone phase shift mask blank according to claim 1, wherein said element of said sputtering target material includes nickel, aluminum, a metal element other than nickel and aluminum, and silicon; and said compound of said sputtering target material is selected from the group consisting of oxide, nitride and oxinitride of nickel, aluminum, metal elements other than nickel and aluminum, and silicon.

8. The method of manufacturing a halftone phase shift mask blank according to claim 7, wherein said metal elements other than aluminum and nickel are transition metal elements.

9. The method of manufacturing a halftone phase shift mask blank according to claim 1, wherein said element of said sputtering target material is selected from the group consisting of molybdenum, chromium, tungsten, tantalum, cobalt, vanadium, palladium, titanium, niobium, zinc, zirconium, hafnium, germanium, platinum, manganese and iron.

10. The method of manufacturing a halftone phase shift mask blank according to claim 1, wherein said semitransparent film is formed using a mixture of a gas containing at least one element selected from the group consisting of nitrogen, hydrogen and oxygen and an inert gas as a sputtering gas.

11. The method of manufacturing a halftone phase shift mask blank according to claim 1, wherein said sputtering target material used has a substantial oxygen content of from 0 to 70 atm % and a substantial nitrogen content of from 0 to 65 atm % and said semitransparent film prepared using said sputtering target material has an oxygen content of from 0 to 65 atm % and a nitrogen content of from 0 to 60 atm %.

12. The method of manufacturing a halftone phase shift mask blank according to claim 1, wherein a discharge to be applied to said sputtering target to produce plasma is any of dc, ac having a frequency of not more than 500 KHz and high frequency wave having a frequency of 13.56 MHz.

13. The method of manufacturing a halftone phase shift mask blank according to claim 1, wherein said sputtering target material comprises at least one compound selected from the group consisting of oxide and oxinitride of said metal elements.

14. The method of manufacturing a half tone phase shift mask blank according to claim 13, wherein said sputtering target material further comprises at least one compound selected from the group consisting of oxide and oxinitride of silicon.

15. The method of manufacturing a halftone phase shift mask blank according to claim 1, wherein the metal elements are transition metal elements.

16. A method of manufacturing a halftone phase shift mask, which comprises forming a semitransparent mask pattern to be transferred to a wafer on a transparent substrate using a halftone phase shift mask blank prepared by the process defined in claim 1.

17. A method of manufacturing a halftone phase shift mask, which comprises subjecting a semitransparent film formed on a transparent substrate by the process defined in claim 1 to dry etching with a gas containing chlorine and/or gas containing fluorine.

18. A method of manufacturing a halftone phase shift mask blank for the preparation of a phase shift mask comprising the steps of forming a semitransparent film on a transparent substrate, said semitransparent film being capable of making the phase of light transmitted through said semitransparent film different from that of light transmitted directly through said transparent substrate by a predetermined amount and reducing an intensity of light transmitted through said semitransparent film, wherein the step of forming said semitransparent film comprises a sputtering step using a sputtering target material, and said sputtering target is a composition selected from the group consisting of:
(1) silicon, silicon oxide and tantalum,
(2) silicon nitride and tantalum oxide,
(3) silicon, silicon oxide and nickel,
(4) silicon nitride and nickel oxide,
(5) silicon, silicon oxide, nickel and tantalum,
(6) silicon nitride, nickel oxide and tantalum oxide,
(7) silicon, silicon oxide, nickel and molybdenum,
(8) silicon nitride, nickel oxide and molybdenum oxide,
(9) silicon, silicon oxide, aluminum and tantalum,
(10) silicon nitride, aluminum oxide and tantalum oxide,
(11) silicon, silicon oxide, nickel and aluminum,
(12) silicon nitride, nickel oxide and aluminum oxide,
(13) silicon, silicon oxide and cobalt,
(14) silicon, silicon nitride and cobalt oxide,
(15) silicon, silicon oxide and tungsten,
(16) silicon nitride and tungsten oxide,
(17) silicon, silicon oxide and chromium,
(18) silicon nitride and chromium oxide,
(19) silicon, silicon oxide, nickel and cobalt,
(20) silicon nitride, nickel oxide and cobalt oxide,
(21) silicon, silicon oxide, nickel and tungsten,
(22) silicon nitride, nickel oxide and tungsten oxide,
(23) silicon, silicon oxide, nickel and chromium,
(24) silicon nitride, nickel oxide and chromium oxide,
(25) silicon, silicon oxide, aluminum and cobalt,
(26) silicon nitride, aluminum oxide and cobalt oxide,
(27) silicon, silicon oxide, aluminum and tungsten,
(28) silicon nitride, aluminum oxide and tungsten oxide,
(29) silicon, silicon oxide, aluminum and chromium,
(30) silicon nitride, aluminum oxide and chromium oxide.

* * * * *